United States Patent [19]

Burrows

[11] Patent Number: 4,558,236
[45] Date of Patent: Dec. 10, 1985

[54] UNIVERSAL LOGIC CIRCUIT
[75] Inventor: James L. Burrows, Merrimack, N.H.
[73] Assignee: Sanders Associates, Inc., Nashua, N.H.
[21] Appl. No.: 542,878
[22] Filed: Oct. 17, 1983
[51] Int. Cl.[4] .......................................... H03K 19/094
[52] U.S. Cl. ..................................... 307/465; 307/448; 307/469; 307/471; 307/291
[58] Field of Search ............... 307/445, 448, 465, 468, 307/469, 471, 243, 577, 579, 584, 585, 279, 291

[56] References Cited
U.S. PATENT DOCUMENTS

| | | | |
|---|---|---|---|
| 3,439,185 | 4/1969 | Gibson | 307/469 |
| 3,691,401 | 9/1972 | Forlani et al. | 307/468 X |
| 3,980,897 | 9/1976 | Arnold | 307/469 |
| 4,233,524 | 11/1980 | Burdick | 307/468 |
| 4,417,161 | 11/1983 | Uya | 307/471 |
| 4,453,096 | 6/1984 | Le Can et al. | 307/448 |

OTHER PUBLICATIONS

Gurski, "FET Logic Bridge Circuit", IBM Tech Disc Bull, vol. 11, No. 7, Dec. 1968, p. 812.

*Primary Examiner*—Stanley D. Miller
*Assistant Examiner*—D. R. Hudspeth
*Attorney, Agent, or Firm*—Louis Etlinger; Wm. F. Porter, Jr.

[57] ABSTRACT

A universal logic circuit that performs a selected one of several logic operations on a pair of input signals in response to the receipt of a control signal and the terminals to which the input signals and control signal are coupled.

9 Claims, 14 Drawing Figures

1

UNIVERSAL LOGIC CIRCUIT

BACKGROUND OF THE INVENTION

1. Field of the Invention

The invention relates generally to the field of digital logic circuits, and more specifically to a specific digital logic circuit which can perform a plurality of logical functions on input signals by appropriate selection of the connection of input and control signals to the circuit's input terminals.

2. Background of the Prior Art

In many cases, it is desirable to provide one circuit design that can be used to perform a plurality of logic operations on a pair of input signals. Such a circuit design can simplify the design and layout of complex combinatorial logic circuits on, for example, integrated circuit chips, since the same circuit masks can be used wherever any of the logic operations that the circuit can perform are to be performed in the circuit.

SUMMARY OF THE INVENTION

The invention, therefore, aims to provide a circuit that can perform a plurality of logic operations on a pair of input signals, depending on the circuit's input terminals, to which the input signals and control signals are connected. The circuit can additionally perform other terminal logic operations depending upon the connection of an output terminal to an input terminal of the circuit and the selection of the input terminal to which the input signal is coupled.

The circuit includes a multiplexer network which has a select input terminal, two other input terminals and an output terminal to which an inverter network is connected. The inverter network provides an inverted, or complemented output signal as well as the non-inverted signal as supplied by the multiplexer network. By appropriate selection of the connection of the input signals to one of the multiplexer's two input terminals and to the select terminal, and the connection of a control signal to the other input terminal, six different logic operations can be performed by the circuit. Furthermore, by selective connection of an output terminal to one of the input terminals, four different flip-flop operations can be performed, with the clock input being connected to the select input terminal of the multiplexer network. Finally, the circuit can also perform the multiplexer operation on the input signals.

BRIEF DESCRIPTION OF THE DRAWINGS

The invention is pointed out with particularity in the appended claims. The above and further objects and advantages of the invention may be better understood by referring to the following description taken in conjunction with the accompanying drawings, in which:

DESCRIPTION OF THE PREFERRED EMBODIMENTS

Figure 1:
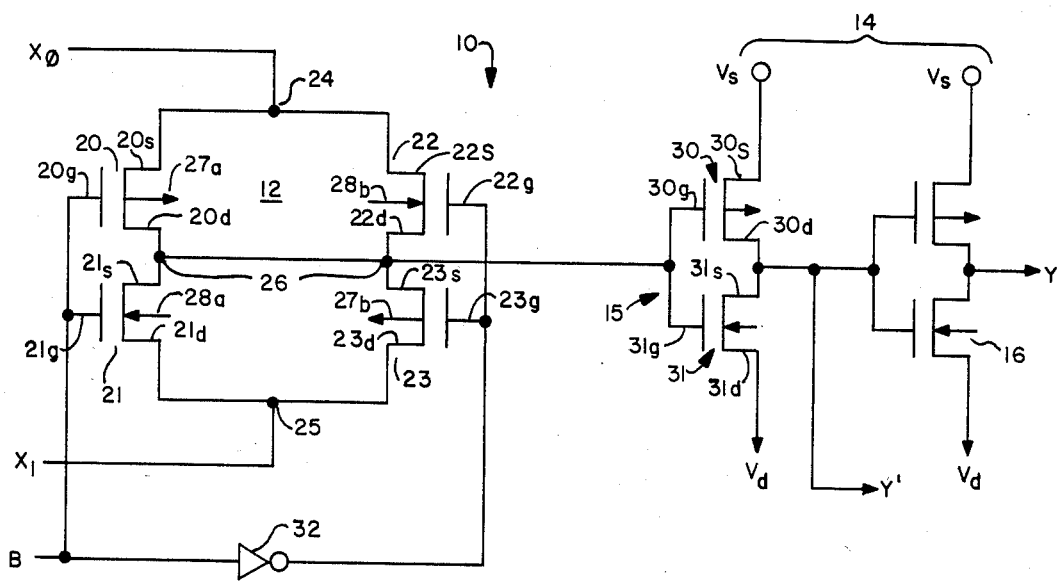
FIG. 1 is a circuit diagram of a universal logic element according to the invention.

With reference to FIG. 1, a universal logic element 10 according to the invention includes a multiplexer network 12 and an inverter network 14. The multiplexer 12 receives an input signal at the $X_0$ and $X_1$ input terminals and a select signal at a B input terminal. The select signal couples the input signal at one of the terminals to the inverter network 14. The inverter network includes two inverters 15 and 16. Inverter 15 receives the output signal from the multiplexer network 12 and inverts it to produce a Y' output signal, and the second inverter 16 receives the Y' output signal from inverter 15, inverts it again to form the Y output signal.

More specifically, the multiplexer network 12 includes a network of metal oxide semiconductor field effect transistors (MOSFETs) 20, 21, 22, and 23. Each transistor has a source input designated by the letter "s", a drain output designated by the letter "d", and a gate input designated by the letter "g". Transistors 20 and 21 are connected in series between the $X_0$ input terminal 24 and the $X_1$ input terminal 25 so that the source input 20s of transistor 20 is connected to $X_0$ input 24, the drain input 20d is connected to source input 21s of transistor 21, and the drain output 21d of transistor 21 is connected to the $X_1$ input terminal 25. Similarly, transistors 22 and 23 are connected in series between $X_0$ terminal 24 and $X_1$ terminal 25, with the drain terminal 22d of transistor 22 connected to the source terminal 23s of transistor 23. The select terminal is connected to the gates 20g and 21g of transistors 20 and 21, and, through an inverter 32, to the gates 22g and 23g of transistors 22 and 23. The output terminal 26 of multiplexer network 12 is from the connection between the drain and source terminals of transistors 20 and 21, and transistors 22 and 23, which are connected together in a "wired OR" configuration.

In one specific embodiment, transistors 20 and 23 are n-channel FETs, and transistors 21 and 22 are p-channel FETs. The n-channel FETs are designated by the outwardly going arrows 27A and 27B, and the p-channel FETs are designated by the inwardly going arrows 28A and 8B.

The B input signal is applied directly to gate terminals 20g and 21g of transistors 20 and 21. A complemented B signal, inverted by an inverter 32, is applied to terminals 22g and 23g of transistors 22 and 23. Because the channels of the transistors are of different types, when the B signal is asserted, the channel of transistor 21 is opened and the channel of transistor 20 is pinched off. The inverted B signal applied to transistors 22 and 23 opens the channel of transistor 23, and pinches off the channel of transistor 22. Accordingly, when the B input signal is asserted, the $X_1$ signal is coupled through transistors 21 and 23 to output terminal 26. When the B input signal is asserted, the Y output signal accordingly conforms to the $X_1$ input signal.

Conversely, if the B input signal is negated, the channels of transistors 21 and 23 are pinched off, and the channels of transistors 20 and 22 are open. Accordingly, the $X_0$ input signal is coupled by transistors 20 and 22 to output terminals 26, and the Y output signal is equivalent to the $X_0$ input signal. The Y' output signal in both instances is the converse or inverse of the Y output signal.

Inverters 15 and 16 are identical, and only inverter 15 will be described in detail. Inverter 15 includes two transistors 30 and 31 which are MOSFETs each of which includes a source, gate and drain terminal. The source terminal 30s is connected to a source voltage $V_s$, and the drain terminal 30d is connected to the source terminal 31s of transistor 31. The drain terminal 31d is connected to a drain voltage source $V_d$, which may be at ground potential. The output terminal 26 of multiplexer 12 is connected to the gate terminals 30g and 31g of transistors 30 and 31 and enables them in tandem. Like transistors 20 and 23, transistor 30 is an n-channel FET. Similarly, transistor 31 is a p-channel FET, like transistors 21 and 22.

As has been mentioned, by appropriate connection of input signals and a control signal to the B, $X_0$ and $X_1$ terminals, the circuit in FIG. 1, can perform a number of logic operates on the input signals, including OR, AND, Exclusive OR, and a pass/invert operation. The appropriate connections for performing such operations are depicted in FIGS. 2A through 2F.

Figure 2A:
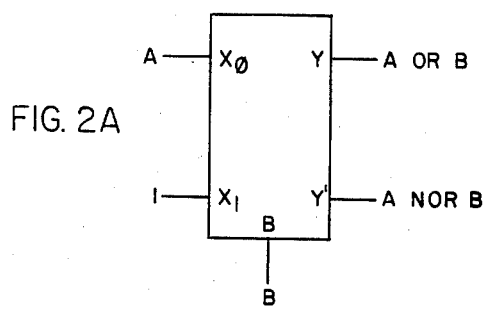
FIGS. 2A through 2F depict input, control and output signals coupled to and received from the various input and output terminals of the circuit of FIG. 1 for performing six different logic operations on the input signals.

FIG. 2A illustrates the connections necessary to perform an OR operation on two input signals, namely an A input signal, which is connected to the $X_0$ input terminal 24, and a B input signal. An asserted control signal is applied to the $X_1$ input terminal 25. When the $X_1$ terminal 25 is energized by the asserted control signal, the output signal at the Y output terminal contains the function "A OR B". The Y' output carries the complement, or the "A NOR B" function. This can be verified as follows:

(a) If A and B input signals are both negated, then the channels of transistors 20 and 22 are opened, and the channels of transistors 21 and 23 are pinched off. Accordingly, the A input signal applied to terminal 24 is coupled to output terminal 26. Since the A input signal is negated, the signal at terminal 26 is also negated. Accordingly the Y output signal is also negated.

(b) If the A and B input signals are both asserted, the channels of transistors 20 and 22 are pinched off, and the channels of transistors 21 and 23 are opened by the asserted B input signal. The asserted control signal at the $X_1$ terminal 25 is thus coupled to the output terminal 26. Accordingly, the Y output signal is asserted, as required by the "A OR B" function.

(c) If the A input signal is asserted, and the B input signal is negated, the negated B input signal causes the channels of transistors 21 and 23 to be pinched off, and opens the channels of transistors 20 and 22. The asserted A input signal at $X_0$ terminal 24 is thus coupled to output terminal 26. The Y output signal is accordingly asserted.

(d) If the A input signal is negated and the B input signal is asserted, the channels of transistors 20 and 22 are pinched off and the channels of transistors 21 and 23 are opened. The asserted signal at the $X_1$ input terminal 25 is thus coupled to output terminal 26. The Y output signal is accordingly asserted.

It can be seen, therefore, that when an asserted control signal is applied to $X_1$ terminal 25, multiplexer network 12 passes an asserted signal if either of the A or B input signals connected to the $X_0$ and B input terminals respectively is asserted and a negated output signal only if both the A and B signal are negated. This is the OR logic operation on the A and B input signals. Accordingly, by coupling an asserted control signal to the $X_1$ input terminal 25, the element 10 operates as a conventional OR gate.

Figure 2D:
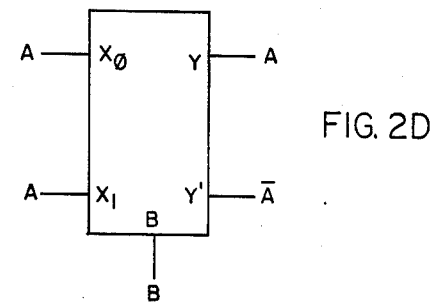
Figure 2B:
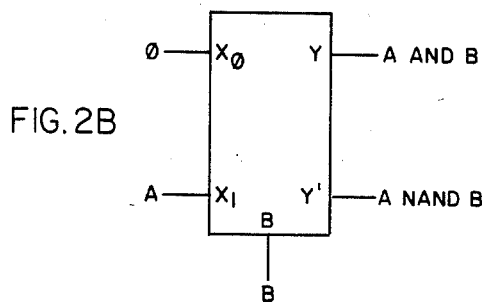
Figure 2E:
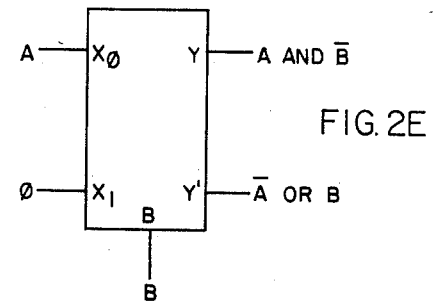
Figure 2C:
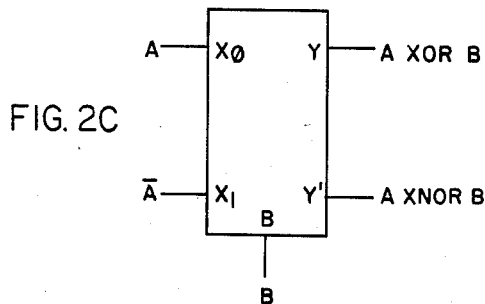

The remaining circuits in FIGS. 2B through 2F can be illustrated in the same way. In FIG. 2B, if a negated control signal is coupled to the $X_0$ input terminal 24, the output signal at the Y output terminal constitutes the AND the A and B input signals, and the signal at Y' output terminal is the NAND of the same input signals. As depicted in FIG. 2C, if the $X_0$ input terminal 24 receives the A input signal, and the $X_1$ terminal 25 carries the A' complement signal, the signal at the Y output terminal is the A XOR B (Exclusive OR), and the signal at the Y' terminal is the A XNOR B (Exclusive NOR) of the input signals.

Continuing to FIG. 2D, if the $X_1$ and $X_0$ terminals 25 and 24 both receive the A input signal, the output signal at the Y terminal of element 10 is the A signal, and the output signal at the Y' output terminal is the complement signal. The circuit 10 can therefore be used as a buffer or an inverter, depending on which output terminal is selected.

The element 10 can be used also to perform more complicated logic operations on the A and B input signals. As shown in FIG. 2E, by coupling a negated control signal to $X_1$ terminal 25, element 10 can be used to perform an AND function on the A input signal applied to the $X_0$ terminal 24 and the complement of the B input signal. The output signal at the Y' output terminal is the OR of the B input signal and the complement of the A input signal.

Figure 2F:
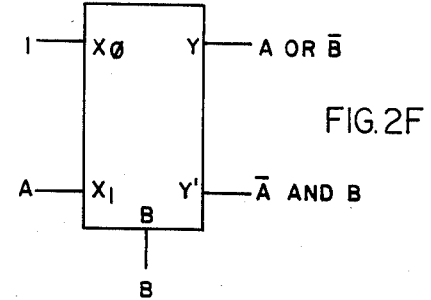

As shown in FIG. 2F, by coupling an asserted control signal to the $X_0$ input terminal 24, and coupling the A input signal to $X_1$ terminal 25 and a B input signal to the B input terminal, the output signal at the Y output terminal is the OR of the A input signal and complement of the B input signal. The output signal at the Y' output terminal is the AND of the B input signal and the complement of the A input signal.

All of the logic functions in FIGS. 2B through 2F can be verified as described above with respect to FIG. 2A.

Figure 3A:
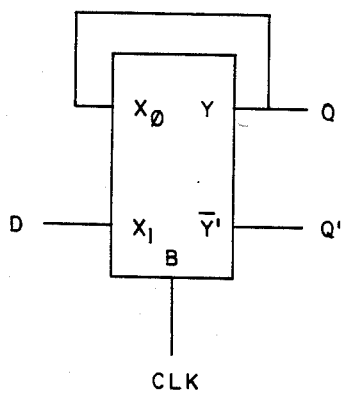
FIGS. 3A through 3D depict the input signals and the connections between an input terminal and output terminal of the circuit in FIG. 1 to achieve four different flip-flop operations.

By selective connection of one of the Y and Y' output terminals to one of the $X_0$ and $X_1$ input terminals 24 and 25, element 10 can be used as a flip-flop to latch the state of a D input signal, applied to the other of the $X_0$ and $X_1$ input terminals when a CLK timing signal, coupled to the B select terminal, is asserted or negated. With reference to FIG. 3A, if the Y output terminal is connected to the $X_0$ input terminal 24, a D flip-flop is formed in which the Q output signal at the Y output terminal latches the logic value of D input signal coupled to the $X_1$ terminal 25 when the CLK timing signal is asserted. This can be verified as follows, with reference to FIG. 1. If the D input signal applied to the $X_1$ terminal 25 is asserted and the B input signal is asserted, the channels of transistors 20 and 22 are pinched off, and the channel of transistors 21 and 23 are open. The asserted D input signal is thus coupled to the output terminal 26, and the Q output signal at the Y output terminal is asserted. Since the Y output signal is asserted, the $X_0$ input terminal 24 is then enabled. If the CLK timing signal at the B input terminal is then negated, the channels of transistors 20 and 22 are open, and the channels of transistors 21 and 23 are pinched off. This couples the asserted signal at terminal 24 to output terminal 26, which maintains the Q output signal at the Y output terminal in an asserted state, regardless of the condition of the D input signal. If the D input signal is then negated, and the B clock signal is asserted, transistors 21 and 23 will couple the negated D input signal to output terminal 26, negating the Q output signal at the Y output terminal. This also negates the signal at the $X_0$ input terminal 24. Thus, when the B clock signal is then negated, transistors 20 and 22 will couple a negated signal to output terminal 26, which will maintain the Q output signal at the Y output terminal at a negated level.

Figure 3B:
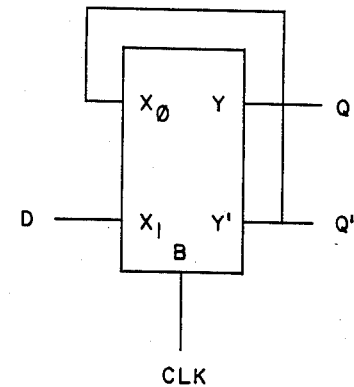

FIG. 3B illustrates the connections for a D' flip-flop, in which the Q output signal at the Y output terminal has the condition of the D input signal while the B clock signal is asserted, and the complement of that signal when the B clock signal is negated. The Q' output signal at the Y' output terminal is coupled to the $X_0$ input terminal 24. The operation of the circuit can be verified in the same manner as the D flip-flop illustrated in FIG. 3A.

Figure 3C:
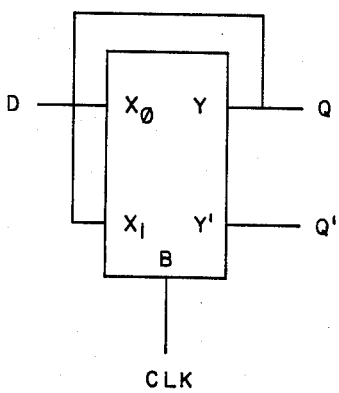

FIG. 3C illustrates the connections to element 10 achieving a D flip-flop for negative assertion clock transitions. That is, the Q output signal at the Y output terminal latches the D input signal on a negative going transition of the CLK timing signal. For this type of flip-flop, the Q output signal is coupled to the $X_1$ input terminal 25, and the D input signal is coupled to $X_0$ input terminal 24.

Figure 3D:
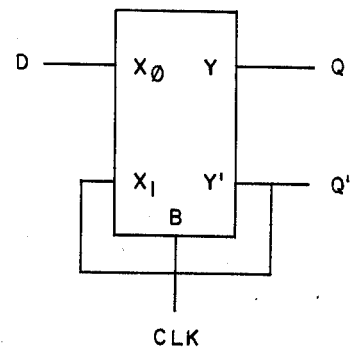

Finally, the FIG. 3D illustrates the connections for a D' flip-flop for a negative going CLK clock signal. For this flip-flop, the Q output signal has the condition of the D input signal when the CLK clock signal is asserted negatively, and the complement of the D input signal when the CLK clock signal is negated positively. To achieve this, the Y' output signal is coupled to the $X_1$ input terminal 25.

The logic operations performed by flip-flops depicted in FIGS. 3C and 3D can be verified as described above for the D flip-flop depicted in FIG. 3A.

Figure 4:
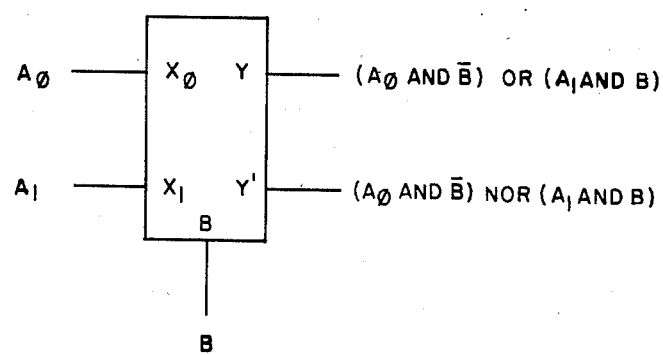
FIG. 4 is a diagram depicting the input and output signals coupled to the circuit depicted in FIG. 1 to enable it to perform a multiplexer operation.

The circuit connections for element 10 to operate as a bit multiplexer are illustrated in FIG. 4. If an $A_0$ input signal is coupled to $X_0$ terminal 24, and an $A_1$ input signal is coupled to input terminal $X_1$, the Y output signal will correspond to the $A_1$ input signal if a B select signal applied to the B select terminal is asserted, or the $A_0$ input signal if the B select signal is negated. The output signal at the Y' output terminal constitutes the complement of the output signal at the Y output terminal. This can be verified as follows. When the B select signal is asserted, the channels of transistors 20 and 22 are pinched off, and the channels of transistors 21 and 23 are open. Accordingly, the $A_1$ input signal applied to input terminal 25 is coupled to output terminal 26. The Y output signal thus conforms to the $A_1$ input signal. If the B select signal is negated, the channels of transistors 21 and 23 are pinched off, and of transistors 20 and 22 are open. Accordingly, the $A_0$ input signal is coupled to output terminal 26, and the Y output signal conforms to the $A_0$ input signal. In both cases, the output signal at the Y' output terminal constitutes the complement of the output signal at the Y output terminal.

Figure 5A:
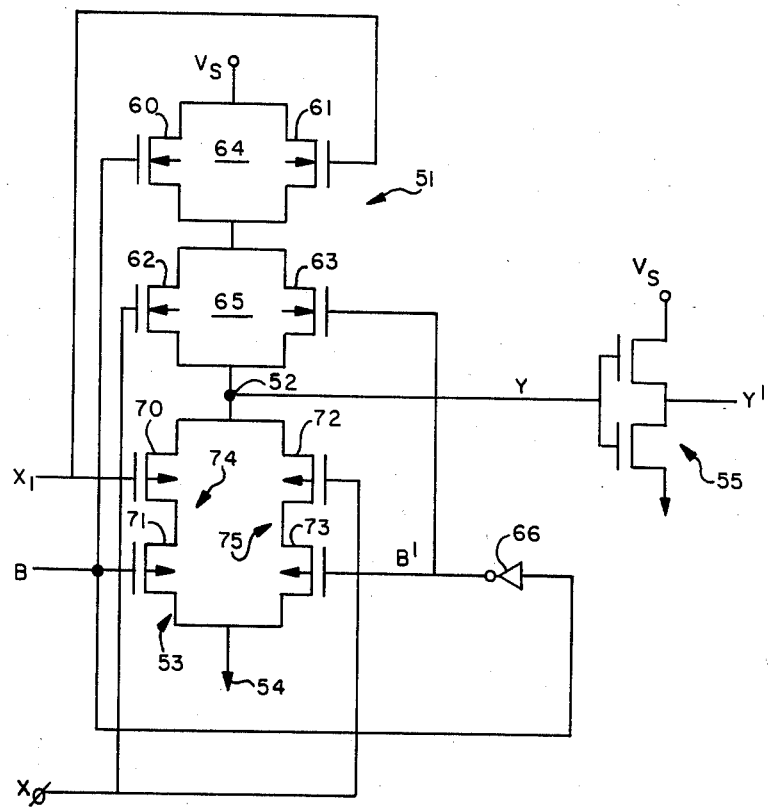
FIGS. 5A and 5B show alternative embodiments of the multiplexer network 12 and inverter network 14 of FIG. 1.

FIG. 5A illustrates an alternative embodiment of the multiplexer network 50 for connection between a source of positive voltage $V_s$ and ground. Network 50 includes two portions, a P network 51 connected between the voltage source $V_s$ and the output terminal 52 and an N network 53 connected between the output terminal and a ground terminal 54. The output terminal 65 transmits a Y output signal and may be connected to an inverter network 55 to provide a complemented output signal Y'. The inverter network 55 operates in a manner similar to the operation of inverter networks 15 and 16 (FIG. 1).

P network 51 includes four P-channel MOSFET transistors, 60 through 63 connected in pairs, with transistors 60 and 61 forming a transistor pair 64 and transistors 62 and 63 forming a transistor pair 65. Transistor 60 is energized if a B input signal is asserted and transistor 61 is energized if an $X_1$ input signal is asserted. When one or both of transistor 60 and transistor 61 are energized, they effectively couple positive voltage from the voltage source $V_s$ to the transistor pair 65.

Transistor pair 65 operates in a manner similar to transistor pair 64, with respect to input signal $X_0$ and the complement of the B input signal B', provided by an inverter 66. Thus, if the B' signal is asserted (that is, if the B signal is negated) or the $X_0$ input signal is asserted, transistor pair 65 couples the voltage from pair 64 to the output terminal 52.

N network 53 comprises four n-channel MOSFET transistors 70 through 73 also connected in pairs 74 and 75. Transistors 70 and 71, which form pair 74, couple output terminal 52 to ground if both transistors are energized, which occurs if both the B and $X_1$ input signals are negated. Similarly, transistors 72 and 73, which form pair 75, couple output terminal 52 to ground if both the B' complementary signal and $X_0$ input signal are negated.

Thus, the Y output signal is high, or asserted, if (a) at least one of the B or $X_1$ input signals is asserted and (b) at least one of the B' signal or $X_0$ input signal is asserted, and is negated if (a) both of the B and $X_1$ input signals are negated or (b) both of the B' and $X_0$ signals are negated. Network 50 thus couples the asserted or negated condition of the $X_0$ input signal to the output terminal 52 if the B input signal is negated, and the asserted or negated condition of the $X_1$ input signal to the output terminal if the B input signal is asserted.

Figure 5B:
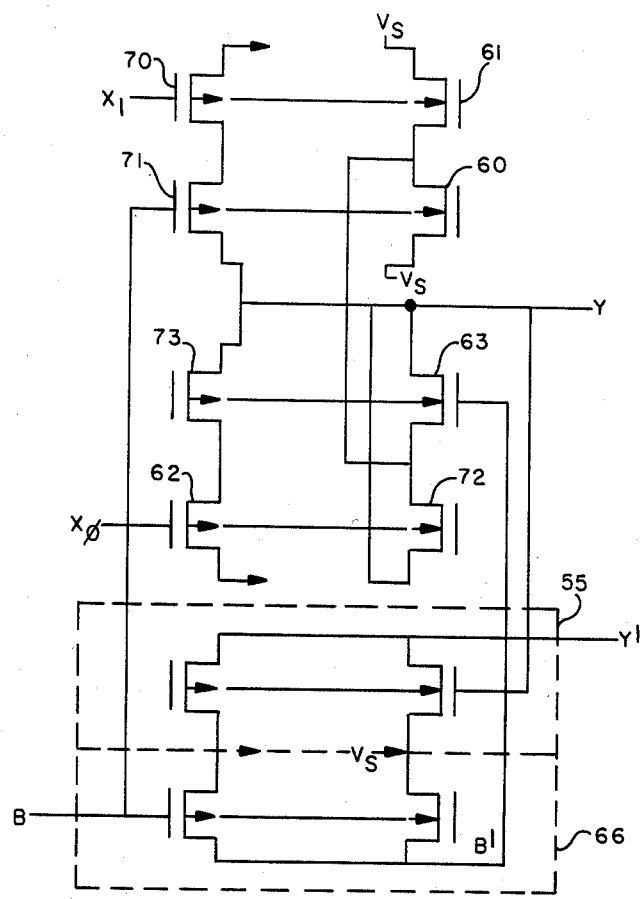

A benefit of the circuit depicted in FIG. 5A is that it can be easily rearranged as shown in FIG. 5B to provide a CMOS (complementary-MOS) gate array implementation, in which there are alternating rows of p- and n- channel transistors.

The foregoing is limited to several specific embodiments of this invention. It will be appreciated by those skilled in the art that the invention can be practiced using circuits of diverse basic constructions than those disclosed herein. For example, the inverter network 14 could comprise one inverter instead of two, and the Y output terminal could be taken as the output terminal 26 of multiplexer network 12. However, for buffering purposes, it may be advantageous to provide a second inverter in inverter network 14 as described herein. Further, an element 10 according to the invention could be constructed with only transistor 20 and 21, or 22 and 23, in the multiplexer network 12, with no loss of the logical operations performed by a circuit constructed in accordance with the invention.

It is therefore the object of the appended claims to cover all modifications and variations as come within the true spirit and scope of this invention.

What is claimed as new and desired to be secured by Letters Patent of the United States is:

1. A universal logic element including a plurality of input terminals and an output terminal that transmits digital output signals, the universal logic element performing one of a plurality of logic operations on a pair of digital input signals, the logic operation being selected by the selective connection of the input signals and a digital control signal to the input terminals, the universal logic element comprising a digital multiplexer network including a pair of input signal terminals, to which are coupled one of the input signals and the control signal, and a select terminals, the input signal terminals and the select terminal together comprising the input terminals of the universal logic element, and an output terminal that comprises the output terminal of said universal logic element, the multiplexer network coupling either the input signal at said one of the input signal terminals or the control signal at the other of the input signal terminals to the output terminal depending on the condition of the input signal that is coupled to the select terminal, the signal at the output terminal comprising the logical result of the selected logic operation on the input signals, the multiplexer network further including two networks of field effect transistors of opposite conductivity types, the first network being connected between a terminal for connection to a first voltage source and said output terminal, and the second network being connected between said output terminal and a terminal for connection to a second voltage source having a voltage different from the voltage of said first voltage source, each of the networks comprising pairs of field effect transistors with one transistor in each pair being respective to one of the input signals and another transistor in each pair being responsive to the select signal to couple the voltage level of either the first or the second voltage source to said output terminal in response to selected conditions of said input signals and said select signal.

2. A universal logic element as defined in claim 1 further comprising an inverter network including an input terminal connected to the output terminal of said multiplexer network, said inverter network including means for generating an output signal that is the complement of the signal at the inverter network input terminal.

3. A universal logic element as defined in claim 2 in which said inverter network further includes second means connected to said first complement signal generating means for generating an output signal that is the complement of the signal generated by the complement signal generating means, said inverter network further comprising a second output terminal connected to said second complement signal generating means for transmitting the output signal thereof.

4. A universal logic element as defined in claim 1 further comprising means for coupling the output signal to one of the input signal terminals, the other input signal terminal receiving a data signal and the select terminal receiving a clock signal, the output signal of said universal logic element after the negation of said clock signal reflecting the condition of said data signal during the assertion of said clock signal.

5. A universal logic element as defined in claim 1 wherein said first voltage terminal is connected to a source of positive voltage and said second voltage terminal is connected to ground, said first network comprising two pairs of p-channel transistors, the transistors in each pair being connected in parallel and the pairs being connected in series between said first voltage terminal and said output terminal, with one transistor in each pair being connected to one of the input signals and the other transistor in each pair being responsive to the select signal.

6. A universal logic element as defined in claim 1 wherein said first voltage terminal is connected to a source of positive voltage and said second voltage terminal is connected to ground, said second network comprising two pairs of n-channel transistors, the transistors in each pair being connected in series, and the pairs being connected in parallel between said output terminal and said second voltage terminal, with one transistor in each pair being connected to one of the input signals and the other transistor in each pair being responsive to the select signal.

7. An OR gate for transmitting an asserted signal only when one of two input signals is asserted comprising a digital multiplexer network including a pair of input terminals, one of which receives one of the input signals, the other input terminal comprising a control terminal for receiving an asserted control signal, and a select terminal which receives the other input signal, and an output terminal, the muliplexer network coupling either the input signal at said one of the input terminals or the control signal to the output terminal, depending on the state of the input signal at said select terminal such that the output signal is asserted whenever either of said input signal is asserted, the multiplexer network further including two networks of field effect transistors of opposite conductivity types, the first network being connected between a terminal for connection to a first voltage source and said output terminal, and the second network being connected between said output terminal and a terminal for connection to a second voltage source having a voltage different from the voltage of said first voltage source, each of the networks comprising pairs of field effect transistors with one transistor in each pair being responsive to one of the input signals and another transistor in each pair being responsive to the select signal to couple the voltage level of either the first or the second voltage source to said output terminal in response to selected conditions of said input signals and said select signal.

8. An AND gate for transmitting an asserted signal only when both of two input signals are asserted comprising a digital multiplexer network including a pair of input terminals, one of which receives one of the input signals, the other input terminal comprising a control terminal for receiving a negated control signal, and a select terminal which receives the other input signal, and an output terminal, the multiplexer network coupling either the input signal at said one of said input terminals or said select terminal only if both signals are asserted, the multiplexer network further including two networks of field effect transistors of opposite conductivity types, the first network being connected between a terminal for connection to a first voltage source and said output terminal, and the second network being connected between said output terminal and a terminal for connection to a second voltage source having a voltage different from the voltage of said first voltage source, each of the networks comprising pairs of field effect transistors with one transistor in each pair being responsive to one of the input signals and another transistor in each pair being responsive to the select signal to couple the voltage level of either the first or the second voltage source to said output terminal in response to selected conditions of said input signals and said select signal.

9. An Exclusive OR gate for transmitting an asserted signal only when one of two input signals is asserted comprising a digital multiplexer network including a pair of input terminals, one of which receives one of the input signals and the other of which comprises a control terminal for receiving a control signal constituting the complement of said input signal coupled to the other input terminal, and a select terminal which receives the other input signal, and an output terminal, the multiplexer network coupling either the input signal at said one of said input terminal or said select terminal only if one of said input signals are asserted, the multiplexer network further including two networks of field effect transistors of opposite conductivity types, the first network being connected between a terminal for connection to a first voltage source and said output terminal, and the second network being connected between said output terminal and a terminal for connection to a second voltage having a voltage different from the voltage of said first voltage source, each of the networks comprising pairs of field effect transistors with one transistor in each pair being responsive to one of the input signals and another transistor in each pair being responsive to the select signal to couple the voltage level of either the first or the second voltage source to said output terminal in response to selected conditions of said input signals and said select signal.

* * * * *